United States Patent [19]
Gris

[11] Patent Number: 6,156,594
[45] Date of Patent: Dec. 5, 2000

[54] FABRICATION OF BIPOLAR/CMOS INTEGRATED CIRCUITS AND OF A CAPACITOR

[75] Inventor: Yvon Gris, Tullins, France

[73] Assignee: SGS-Thomson Microelectronics S.A., Gentilly, France

[21] Appl. No.: 08/970,070

[22] Filed: Nov. 13, 1997

[30] Foreign Application Priority Data

Nov. 19, 1996 [FR] France ................................. 96 14410

[51] Int. Cl.$^7$ .............................................. H01L 21/8238
[52] U.S. Cl. ...................... 438/202; 438/234; 438/344; 438/345; 438/349; 438/350; 438/367; 438/368; 438/370; 438/375; 438/482; 438/491; 438/545; 438/548; 438/564
[58] Field of Search ................................. 438/202, 205, 438/234, 344, 345, 349, 350, 365, 366, 367, 368, 370, 375, 378, 482, 491, 530, 532, 545, 548, 558, 564, FOR 160, FOR 165, FOR 309, FOR 312, FOR 322, FOR 219; 148/DIG. 9, DIG. 123, DIG. 124, DIG. 151

[56] References Cited

U.S. PATENT DOCUMENTS

| | | | |
|---|---|---|---|
| 4,215,418 | 7/1980 | Muramatsu | 364/757 |
| 4,276,543 | 6/1981 | Miller et al. | 340/347 AD |
| 4,338,138 | 7/1982 | Cavaliere et al. | 148/1.5 |
| 4,339,767 | 7/1982 | Horung et al. | 357/44 |
| 4,735,916 | 4/1988 | Homma et al. | 437/57 |
| 4,752,589 | 6/1988 | Schaber | 437/31 |
| 4,799,098 | 1/1989 | Ikeda et al. | 357/43 |
| 4,829,015 | 5/1989 | Schaber et al. | 437/31 |
| 4,931,407 | 6/1990 | Maeda et al. | 437/45 |
| 4,957,874 | 9/1990 | Soejima | 437/31 |
| 4,958,213 | 9/1990 | Eklund et al. | 357/59 |
| 4,960,726 | 10/1990 | Lechchaton et al. | 437/59 |
| 4,965,217 | 10/1990 | Desilets et al. | 437/59 |
| 4,980,302 | 12/1990 | Shimizu | 437/31 |
| 5,008,207 | 4/1991 | Blouse et al. | 437/31 |
| 5,015,594 | 5/1991 | Chu et al. | 437/31 |
| 5,045,484 | 9/1991 | Yamada et al. | 437/31 |
| 5,047,357 | 9/1991 | Ecklund | 437/31 |
| 5,061,645 | 10/1991 | Nakazato et al. | 437/31 |
| 5,089,429 | 2/1992 | Hsu | 437/31 |
| 5,100,815 | 3/1992 | Tsubone et al. | 437/34 |
| 5,128,271 | 7/1992 | Bronner et al. | 437/31 |
| 5,137,840 | 8/1992 | Desilets et al. | 437/32 |
| 5,171,702 | 12/1992 | Prengle et al. | 437/59 |

(List continued on next page.)

FOREIGN PATENT DOCUMENTS

| | | | |
|---|---|---|---|
| 0 495 329 | 7/1992 | European Pat. Off. | H01L 21/82 |
| 0 581 475 A1 | 2/1994 | European Pat. Off. | |
| 0 606 001 A2 | 7/1994 | European Pat. Off. | |
| 0 746 032 | 12/1996 | European Pat. Off. | H01L 27/06 |
| WO 98/05071 | 2/1998 | WIPO . | |

OTHER PUBLICATIONS

Patent Abstracts of Japan, vol. 015, No. 114 (E–1047) & JP–A–03 004538 (Toshiba Corp.), Jan. 10, 1991.
Patent Abstracts of Japan, vol. 018, No. 171 (E–1529) & JP–A–05 343613 (Yamaha Corp.), Dec. 24, 1993.

(List continued on next page.)

*Primary Examiner*—Long Pham
*Attorney, Agent, or Firm*—Wolf, Greenfield & Sacks, P.C.; James H. Morris; Theodore E. Galanthay

[57] ABSTRACT

The present invention relates to a method for fabricating an integrated circuit including MOS transistors and a bipolar transistor of NPN type, including the steps of: forming the MOS transistors, covering the entire structure with a protection layer, opening the protection layer at the base-emitter location of the bipolar transistor, forming a first P-type doped layer of polysilicon, a second layer of silicon nitride and a second oxide layer, opening these last three layers at the center of the emitter-base region of the bipolar transistor, and depositing a third silicon nitride layer, forming spacers, removing the apparent parts of the third layer of silicon nitride, and depositing a third N-type doped polysilicon layer.

37 Claims, 5 Drawing Sheets

U.S. PATENT DOCUMENTS

| | | | |
|---|---|---|---|
| 5,192,992 | 3/1993 | Kim et al. ................................ | 257/370 |
| 5,238,850 | 8/1993 | Matsunaga et al. ...................... | 437/40 |
| 5,286,667 | 2/1994 | Lin et al. ................................. | 437/52 |
| 5,321,650 | 6/1994 | Kikuchi et al. .......................... | 365/177 |
| 5,354,699 | 10/1994 | Ikeda et al. .............................. | 437/34 |
| 5,395,782 | 3/1995 | Ohkoda et al. .......................... | 437/47 |
| 5,403,758 | 4/1995 | Yoshihara ................................ | 437/31 |
| 5,416,031 | 5/1995 | Miwa ....................................... | 437/31 |
| 5,429,959 | 7/1995 | Smayling ................................. | 437/34 |
| 5,439,832 | 8/1995 | Nakamura ................................ | 437/31 |
| 5,457,062 | 10/1995 | Keller et al. ............................. | 437/47 |
| 5,471,083 | 11/1995 | Ikeda et al. .............................. | 257/370 |
| 5,471,085 | 11/1995 | Ishigaki et al. .......................... | 257/370 |
| 5,478,760 | 12/1995 | Yang ........................................ | 437/31 |
| 5,488,003 | 1/1996 | Chambers et al. ....................... | 437/31 |
| 5,489,547 | 2/1996 | Erdeljac et al. .......................... | 437/60 |
| 5,547,893 | 8/1996 | Sung ........................................ | 437/52 |
| 5,563,762 | 10/1996 | Leung et al. ............................. | 361/301.4 |
| 5,633,181 | 5/1997 | Hayashi ................................... | 438/234 |
| 5,648,279 | 7/1997 | Imai ......................................... | 437/31 |
| 5,665,615 | 9/1997 | Anmo ...................................... | 438/202 |
| 5,705,410 | 1/1998 | Guegan .................................... | 437/35 |
| 5,753,957 | 5/1998 | Watabe .................................... | 257/378 |
| 5,773,349 | 6/1998 | Ham ........................................ | 438/348 |
| 5,880,000 | 3/1999 | Gris ......................................... | 438/309 |
| 5,953,600 | 9/1999 | Gris ......................................... | 438/200 |
| 5,970,333 | 10/1999 | Gris ......................................... | 438/207 |

OTHER PUBLICATIONS

Hayden, J.D., et al., "An Ultra–Shallow Link Base For A Double Polysilicon Bipolar Transistor," Proceedings Of The Bipolar/BiCMOS Circuits and Technology Meeting, Minneapolis, Minnesota, Oct. 5–6, 1992, , pp. 96–99, Institute of Electrical and Electronics Engineers.

French Search Report from French Patent Application 96 14410, filed Nov. 19, 1996.

IBM Technical Disclosure Bulletin, vol. 33, No. 7, Dec. 1990, New York, US, pp. 401–402, "Simlified Bipolar in Bi–CMOS".

Proceedings of the International Symposium on Circuits and Systems, San Diego, May 10–13, 1992, vol. 6 of 6k, Institute of Electrical and Electronics Engineers, pp. 2683–2686, Scharf B., "BiCMOS Process Design For Mixed–Signal Applications".

Patent Abstracts of Japan, vol. 95, No. 1, Feb. 28, 1995 & JP–A–06 291262 (Sony Corp.).

FABRICATION OF BIPOLAR/CMOS INTEGRATED CIRCUITS AND OF A CAPACITOR

BACKGROUND OF THE INVENTION

1. Field of the Invention

The present invention relates to a line of fabrication of integrated circuits containing, in particular, bipolar and complementary MOS (CMOS) components. This type of line is generally called a BICMOS line.

2. Summary of the Invention

The present invention provides such a line in which the dimensions of an element designed on a mask can be of a dimension lower than or equal to 0.4 µm, for example, from 0.2 to 0.35 µm.

The present invention is to provide such a line in which the properties of the MOS-type components and those of the components of bipolar type are optimized.

Furthermore the present invention is to provide such a line which is compatible with known lines of fabrication of CMOS components.

Furthermore the present invention is to provide such a line which is as simple as possible to reach the desired results.

Furthermore the present invention is to provide such a line which is adapted to the fabrication of capacitors of high capacitance per unit of surface area.

The present invention provides a fabrication method in which are successively implemented the buried layers of the bipolar transistors, the CMOS transistors, the bipolar transistors, and then the interconnects, to decouple the characteristics of the MOS transistors from those of the bipolar transistors and optimize each of these components. After the formation of the MOS transistors, a protection layer enables protection of the MOS transistors during the formation of the bipolar transistors. This same protection layer is then used as a mask for the formation of silicided areas.

More specifically, the present invention provides a method for fabricating an integrated circuit including complementary MOS transistors and a bipolar transistor of NPN type, including the following steps:

forming an N-type epitaxial layer on a P-type substrate, a buried layer being provided at least at the location of the bipolar transistor, forming a thick oxide layer at the locations other than the locations of the wells of the MOS transistors, of a collector well region of the bipolar transistor and of a base-emitter region of the bipolar transistor, forming the MOS transistors and the collector well of the bipolar transistor, covering the entire structure with a protection layer including a first layer of silicon oxide and a first layer of silicon nitride, opening the protection layer at the base-emitter location of the bipolar transistor, forming a first P-type doped layer of polysilicon or amorphous silicon, a second layer of silicon nitride and a second layer of encapsulation oxide, opening these last three layers at the center of the emitter-base region of the bipolar transistor, diffusing the doping contained in the first silicon layer in the underlying epitaxial layer, to form the extrinsic base of the bipolar transistor, implanting an N-type collector doping, implanting a P-type doping to form the intrinsic base of the bipolar transistor, depositing a third silicon nitride layer, depositing a second layer of polysilicon, anisotropically etching the second polysilicon layer to leave in place spacers in the vertical portions thereof, and removing the apparent parts of the third layer of silicon nitride, depositing a third N-type doped polysilicon layer and diffusing the doping to form the emitter of the bipolar transistor, depositing a planarized insulating layer, and performing the metallizations.

According to an embodiment of the present invention, the first layer of silicon oxide has a thickness of around 20 nm and the first to third silicon nitride layers have a thickness of around 30 nm.

According to an embodiment of the present invention, the first silicon layer has a thickness of around 200 nm and the second silicon oxide layer has a thickness of around 300 nm.

According to an embodiment of the present invention, the first silicon layer is obtained by deposition of undoped amorphous silicon, and then by superficial implant of $BF_2$.

According to an embodiment of the present invention, during the step of opening of the first P-type doped polysilicon or amorphous silicon layer, of the second silicon nitride layer, and of the second encapsulation oxide layer, an opening wider than in the second silicon nitride layer is formed in the encapsulation oxide layer, whereby, upon deposition of the third silicon nitride layer, this layer has a larger contact surface area with the second silicon nitride layer.

According to an embodiment of the present invention, this method further includes, before the step of deposition of the third N-type doped polysilicon layer, the step of performing an opening in the second encapsulation oxide layer, to expose a portion of the second silicon nitride layer, whereby, at the level of this opening, the first and third polysilicon layers form a capacitor, the dielectric of which is formed of a portion of the second silicon nitride layer.

According to an embodiment of the present invention, this opening is formed above a thick oxide area.

These characteristics and advantages as well as others, of the present invention, will be discussed in detail in the following non-limiting description of specific embodiments of the present invention, in relation with the accompanying drawings.

DETAILED DESCRIPTION

As usual in the field of the representation of semiconductor components, the various cross-sectional views are not drawn to scale. The lateral and crosswise dimensions of the various layers and regions are arbitrarily enlarged or reduced to facilitate the drawings.

Generally in the following description, the left side of FIGS. 1 to 10 in which a CMOS component is formed will be designated as the CMOS side and the right side of these drawings in which an NPN-type bipolar transistor is formed will be designated as the bipolar side. In the following, the fabrication of an N-channel MOS transistor, of a P-channel MOS transistor, and of an NPN-type bipolar transistor is described. Of course, in a practical implementation, many identical components will be simultaneously formed, as well as possibly other types of elementary components.

According to an aspect of the present invention, the initial steps correspond to known steps of fabrication of CMOS integrated circuits of very small dimensions (minimum dimension, or gate dimension, under 0.35 μm).

Figure 1:
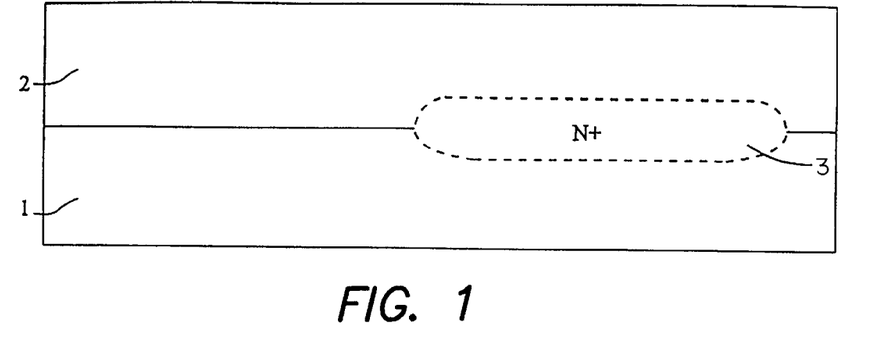
FIGS. 1 to 10 are simplified cross-sectional views illustrating successive steps of fabrication of an embodiment of an N-channel MOS transistor, of a P-channel MOS transistor, and of an NPN-type bipolar transistor according to the present invention.

As shown in FIG. 1, an epitaxial layer 2 of type-N is formed on an initial P-type substrate 1. This epitaxial layer is relatively thin, for example, of a thickness of about 1 to 1.2 μm.

Before the growth of the epitaxial layer, if desired, buried layers of appropriate types are provided in the areas where N or P wells of CMOS transistors are to be formed and a buried layer 3 of type $N^+$ is formed on the bipolar side.

Figure 2:
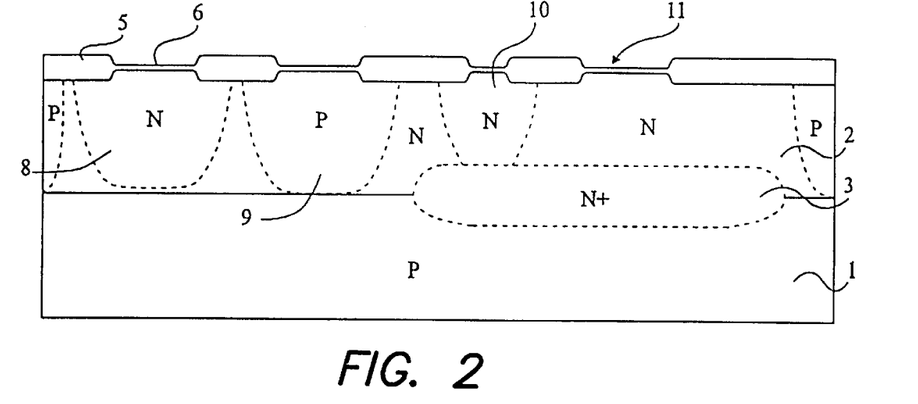

As shown in FIG. 2, on the MOS side, the regions of the MOS transistors are limited by openings in a thick oxide layer 5 formed by any known technique. Through the thick oxide or a thin oxide region 6 formed in the openings, N-type wells 8 and P-type wells 9 are conventionally implanted. These wells are for example formed by a succession of three implants, one of which runs through thick oxide 5 in unmasked regions. These N and P wells are respectively meant for P-channel MOS transistors and N-channel MOS transistors. The surface doping level (some $10^{16}$ at./cm$^3$) determines the threshold voltage of the transistors. In the general case, the P wells (associated with a $P^+$ buried layer) are in electrical contact with the P substrate. It could be, however, provided to form at least some of the P wells on a buried layer of N type. The N wells are completely insulated since they emerge in the P substrate and they are laterally insulated by P regions formed like the P wells.

Simultaneously, on the bipolar side, a region in which a drive-in for recovering the collector contact will be formed or collector well 10 joining buried layer 3 is delimited in thick oxide 5. This collector well is formed by at least some of the implants implemented to form N-type well 8, or by a specific $N^+$-type implant. This collector well can also be formed subsequently at the same time as the sources and drains of the N-channel MOS transistors. Also, an area 11 in which the base and the emitter of an NPN-type bipolar transistor will be formed is delimited in the thick oxide. During the various implants of N and P wells, this area 11 is masked.

Figure 3:
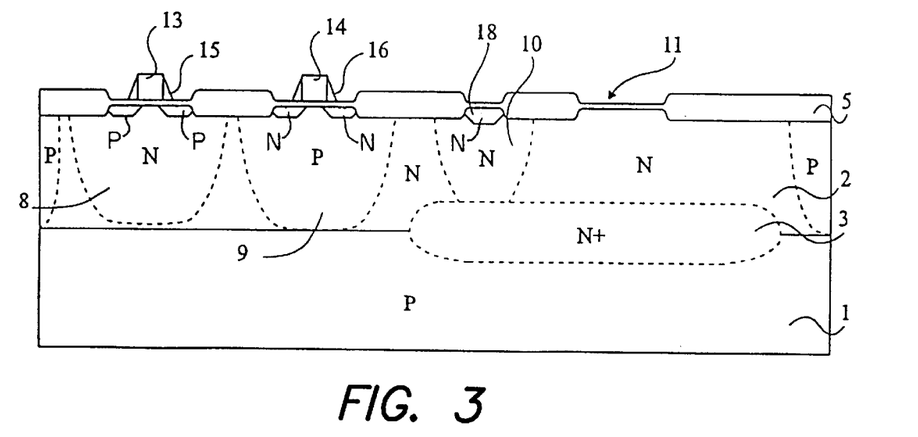

As shown in FIG. 3, on the MOS side, insulated gates 13 and 14 of the MOS transistors are formed conventionally; first implants are performed (LDD); spacers 15 and 16 are formed; and drain and source implants are performed. In well 8, the implants are of type P and, in well 9, the implants are of type N. Concurrently to the making of the source and drain implants of the N-channel transistors in the P wells, a highly-doped N-type diffusion 18 is performed at the surface of collector well 10 to improve the subsequent contact making.

Then, a fast thermal annealing is performed (1025° C.).

After this step, at the end of which most of the MOS transistors has been made (except for the possible contact making silicidations and the metallizations), the NPN-type bipolar transistor is made.

Figure 4:
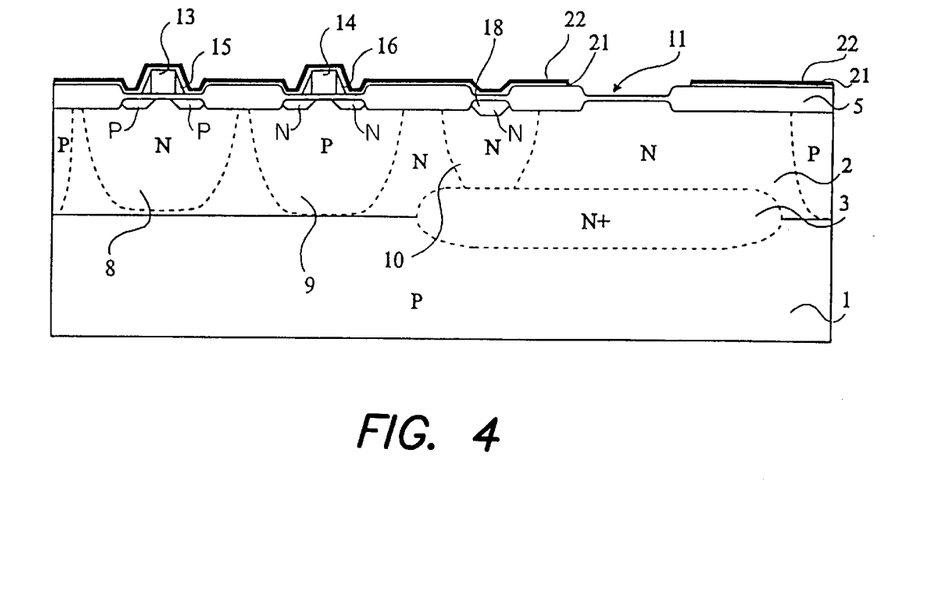

At the step illustrated in FIG. 4, a double protection layer including a silicon oxide layer 21 having, for example, a width of about 20 nm followed by a silicon nitride layer 22 having, for example, a thickness of about 30 nm are deposited over the entire structure, by chemical vapor deposition. This layer 21–22 is open in the area 11 where it is desired to form the emitter-base region of a bipolar transistor. It should be noted that the positioning of this opening is not critical since it stops on thick oxide regions.

Figure 5:
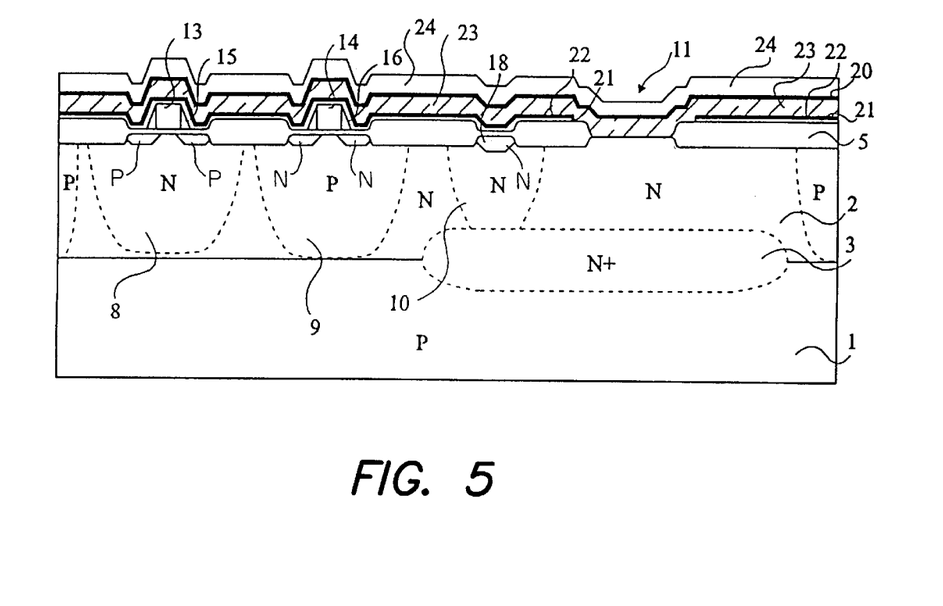

At the step illustrated in FIG. 5, a silicon layer 23 having, for example, a width of around 200 nm followed by a silicon nitride layer 20 having, for example, a thickness of around 30 nm and by an encapsulation oxide 24 having, for example, a thickness of about 300 nm are deposited over the entire structure.

Silicon layer 23 must be P-type doped since it will be used, as will be seen hereafter, as a doping source for the extrinsic base of the NPN transistor and it will be called the base polysilicon. Although it is referred to as the base polysilicon, it could also be any type of deposited silicon layer, for example, amorphous silicon. Preferably, according to an aspect of the present invention, an undoped polysilicon or amorphous silicon layer 23 is first deposited, after which a P-type doping is implanted in this layer. Preferably, boron is implanted in the form of very high dose and low energy $BF_2$ ($10^{15}$ to $10^{16}$ at./cm$^2$) so that the implanted boron concentrates in the upper part of the layer, avoiding implantation of boron in the underlying silicon substrate in region 11.

Figure 6:
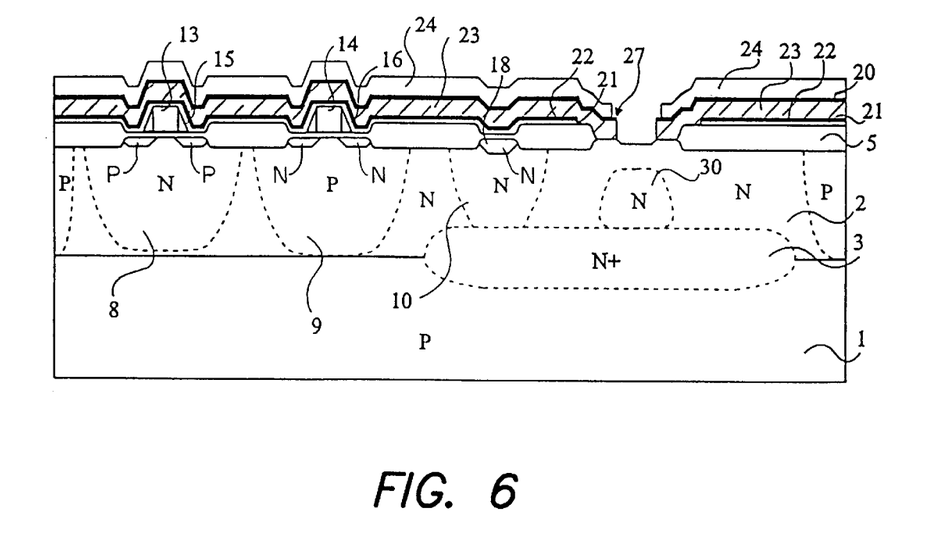

At the step illustrated in FIG. 6, an opening is provided in layers 24, 20 and 23 in the central portion of region 11. This opening has for example a width included between 0.4 and 0.8 μm and penetrates into the monosilicon by less than 50 nm. The etching of silicon oxide layer 24 is preferably implemented so that, after the etching, this layer is slightly in recess with respect to the contour of the opening formed in silicon nitride 20. This is relatively simple to obtain by acting on the etching parameters (pressure, gas . . . ). A step 27 thus appears in the opening area of silicon nitride layer 20.

Then, an N-type doping is implanted to define the collector 30 of the NPN transistor. This collector is thus self-aligned on the opening. The N implant is performed at medium dose and high energy (for example, $10^{12}$ to $10^{14}$ at./cm$^2$ under 500 keV). Thus, an effective collector region of limited lateral extent, substantially equal to that of the intrinsic base which is formed afterwards, is obtained. This contributes to the obtaining of an NPN transistor of having low stray capacitance between the collector and the extrinsic base. The implant is optimized (for example, by successive implants) so that the contour of the collector provides the best possible compromise between, on the one hand, the collector resistance and the time of transit through this collector and, on the other hand, obtaining high enough emitter-collector and base-collector breakdown voltages (typically 4 volts) and a low base-collector capacitance. It should also be noted that this collector implant enables to previously choose an epitaxial layer 2 having a doping and a thickness proper for optimizing the CMOS transistors and then independently optimizing the characteristics of the NPN transistors. Especially, this epitaxial layer can be thicker than if it had to be directly used as a collector layer of the NPN transistor.

Figure 7:
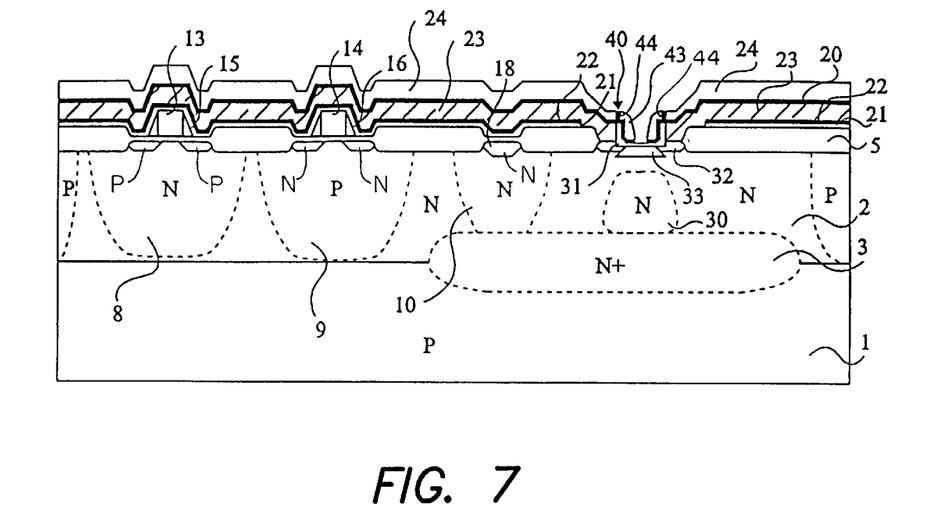

As shown in FIG. 7, after removing the masking resist, a thermal oxidation is performed, during which a thin thermal oxide layer 31 of a thickness of around 5 to 10 nm forms and during which the boron contained in polysilicon layer 23 starts diffusing in the underlying epitaxial layer to form an extrinsic base region 32 having, for example, a junction depth of around 100 nm. This diffusion is then completed by the final annealing of the bipolar structure. A P-type implant is then performed through oxide 31 to form an intrinsic base region 33 at the center of the opening in layers 23, 20 and 24. This intrinsic base is preferably implanted with low energy boron (for example, $10^{13}$ at./cm$^2$ under 5 keV). The contact with polysilicon 23 results from the lateral diffusion of the boron of the polysilicon.

A uniform deposition of a new thin silicon nitride layer 40 (30 nm), and then of a polysilicon layer (100 nm) is then performed. The polysilicon layer is then etched anisotropically so that there only remains spacers 43 on the sides of the opening made in layers 23, 20 and 24. Then, a uniform etching of silicon nitride layer 40 is performed, so that the silicon nitride remains in place only in the regions 44 where it is protected from the etching (chemical or plasma etching) by polysilicon spacers 43. Nitride region 44 and spacers 43 altogether thus define a smaller opening than the opening initially formed in layers 23, 20, and 24 for the definition of the intrinsic base. This smaller opening is the emitter opening. If the spacers have a width of around 150 nm each, this small opening has a width of around 0.5 µm.

According to an aspect of the present invention, the new thin silicon nitride layer 40 "welds" during its deposition to the apparent parts of the contour of the opening formed in silicon nitride layer 20. The provision of above-mentioned step 27 helps the adherence between both silicon nitride layers 20 and 40, as well as a thorough cleaning of the structure before the deposition of layer 40.

An advantage of the provision of silicon nitride layer 20 results from this "welding" with silicon nitride layer 40 which has the effect that any penetration of etching product or any plasma overetching at the vertical interface between the portion of silicon nitride region 44 and silicon oxide layer 24 is blocked by this nitride layer 40. Any risk of short-circuit between polysilicon layer 23 and subsequent conductive layers, and especially polysilicon layer region 46 which will be described hereafter is thus avoided.

Figure 8:
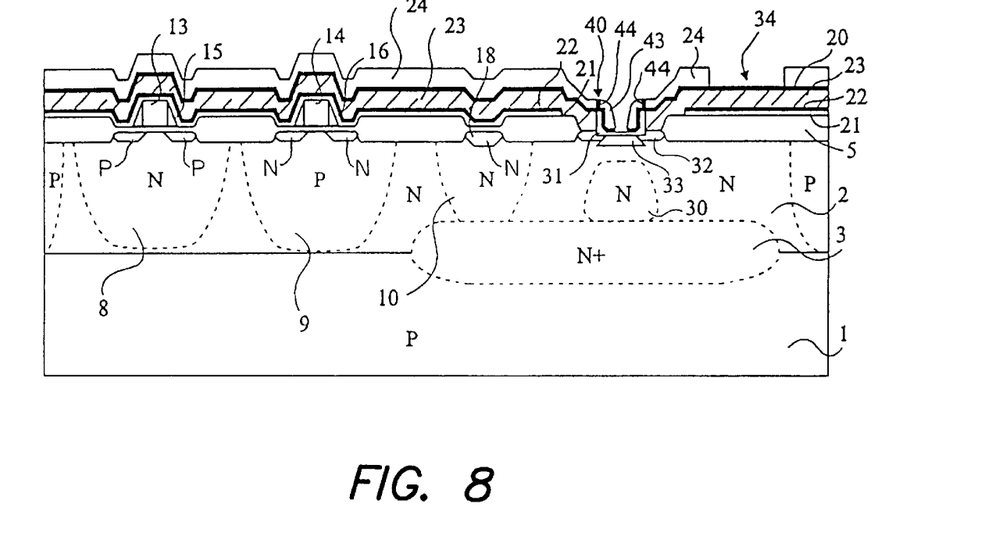

At the step illustrated in FIG. 8, a portion of silicon oxide 24 is removed at a location 34 to clear a portion of silicon nitride layer 20, preferably above a thick oxide layer 5.

Figure 9:
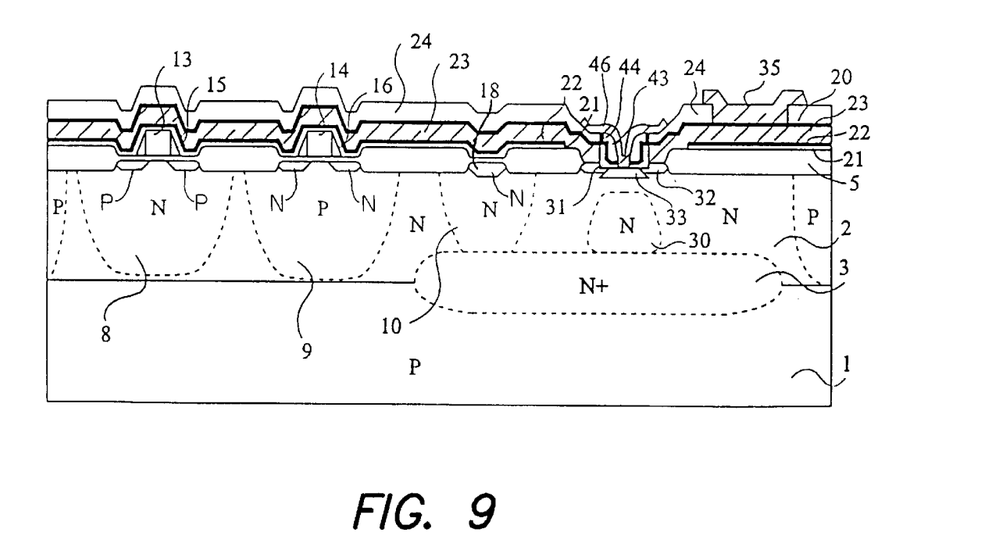

At the step illustrated in FIG. 9, thin oxide layer 31 at the bottom of the opening, which had been used as a protection during the emitter implant (boron) and as an etching stop of silicon nitride layer 40, is thoroughly cleaned, for example in a bath of diluted fluorhidric acid. A highly-doped N-type polysilicon layer is deposited, and then etched to leave in place a region 46 which penetrates in the emitter opening and a region 35 which covers opening 34. This region 35 of the doped polysilicon layer forms an electrode of a capacitor, the other electrode of which corresponds to a region of the base polysilicon 23 which will be etched during a subsequent step. This enables formation of high capacitance capacitors, given the high dielectric constant of the silicon nitride and the low thickness (around 30 nm) of silicon nitride 30.

It should be noted that, during fabrication steps of the NPN transistors, the regions where the MOS transistors have been formed are protected by oxide layer 21, nitride layer 22, base polysilicon layer 23, nitride layer 20, and oxide layer 24. This stacking of layers ensures very efficient protection against any possible contamination and against any crossing of the dopings implanted for the formation of the bipolar transistor.

Figure 10:
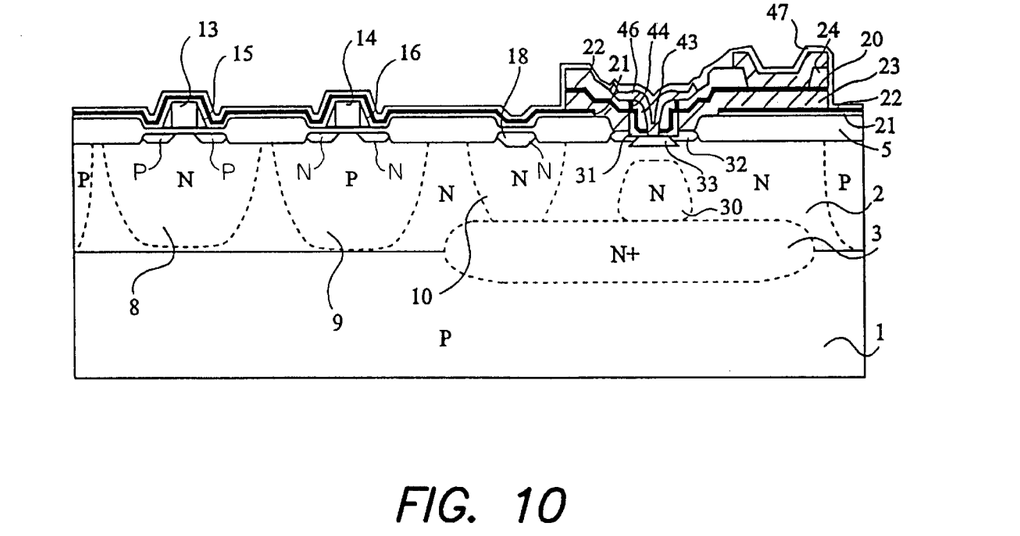

At the step shown in FIG. 10, the oxide, nitride and base polysilicon layers 24, 20, and 23 are removed outside the emitter-base region of the bipolar transistor and other possible regions including devices using portions of the base polysilicon layer 23 (resistors, capacitors. . . ) and notably the region where the silicon nitride dielectric capacitor has been formed. Then, an encapsulation silicon oxide layer 47 is deposited.

Afterwards, an annealing is performed to have the doping penetrate into polysilicon layer region 46 at the center of the base region of the transistor to form its N-type emitter 49. The annealings asociated with the bipolar transistor ensure an electric reactivation of the dopings and lead to junction depths of about 60 m. The annealings are of fast thermal annealing type and/or furnace annealing type. The thermal processing (30 s, 1000° C.) is lighter than for the MOS transistors which are thus not affected.

Encapsulation silicon oxide, silicon nitride, and protection silicon oxide layers 47, 22, and 21 are then removed above the active and/or polysilicon layers which are desired to be silicided, and a metal silicide is formed selectively above the exposed monosilicon and polysilicon layers.

Figure 11:
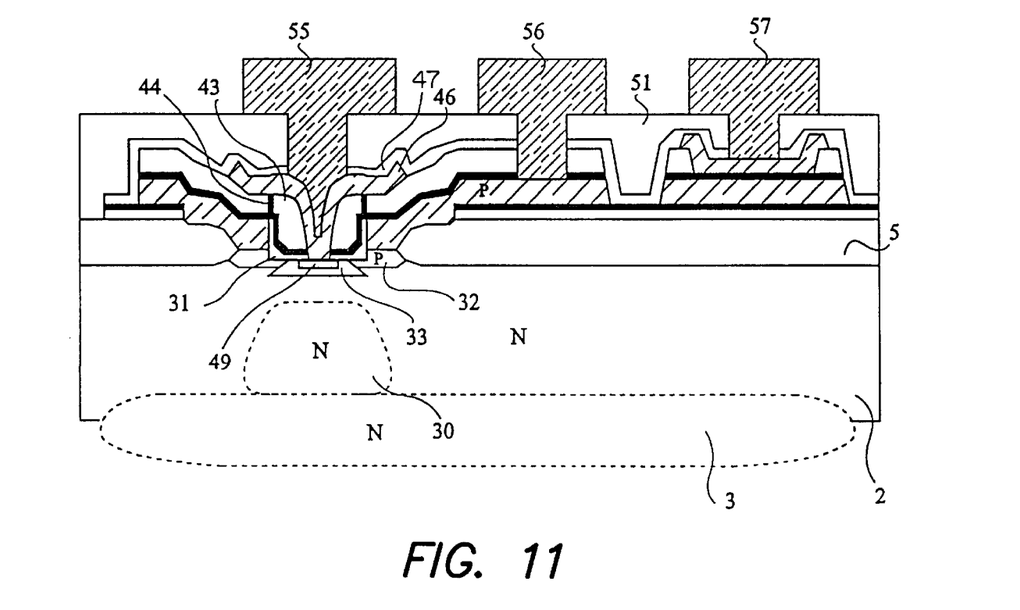
FIG. 11 is an enlarged cross-sectional view of a bipolar transistor of NPN type and of a capacitor obtained according to the present invention.

FIG. 11 shows at a larger scale the final structure of the emitter-base region of the bipolar transistor and of the capacitor obtained by the method according to the present invention.

An insulating planarization layer 51 has been deposited by any known method, for example, by deposition of a boron and phosphorus-doped glass layer (BPSG) and has been annealed, then this layer and possible underlying layers have been opened at the locations where contacts are desired to be made. Only emitter contact 55, base contact 56, and a capacitor electrode contact 57 have been shown.

In a specific embodiment, and to give an example of orders of magnitude, it may be chosen to implement a structure with the following numeric data (where e designates a width, and Cs a superficial concentration or a mean concentration for a homogeneous layer):

substrate 1: Cs=$10^{15}$ at./cm$^3$, epi layer 2: Cs=$10^{16}$ at./cm$^3$, e=0.8 to 1.4 µm, buried layer 3: Cs=$10^{20}$ at./cm$^3$, oxide 5: e=0.5 µm, N or P sources and drains: Cs=$10^{20}$ at./cm$^3$, e=0.15 µm.

The fabrication process according to the present invention, while being perfectly compatible with existing lines of fabrication of high definition CMOS transistors, enables implementation of a bipolar transistor, the collector, intrinsic base, and emitter regions of which are self-aligned and wherein the risks of emitter-base short-circuit are practically eliminated, whatever the processing used to clean the emitter window. The same silicon nitride layer is used to avoid short-circuit risks and is used as a dielectric of capacitor formed between portions of base and emitter polysilicon.

This bipolar transistor has many advantages. Its performance does not suffer from the presence of the CMOS transistors. It can, in particular, be used at radiofrequencies (cut-off frequency higher than 40 GHz). The very high transconductance and the low noise of the bipolar transistor make it useful in analog applications. In particular, the base contact (in P$^+$ polysilicon) enables an advantageous and large reduction of the base resistance, which results in an advantageous improvement in noise factor RF. Thus, the bipolar transistor can be used instead of some AsGa transistors with a lower cost and the possibility of associating this transistor on a the same chip with a high-performance CMOS circuit.

Those skilled in the art will note that other components can be devised while using the line according to the present invention and that this line is likely to have several alterations, modifications, and improvements. In particular, the numeric values indicated have been indicated as an example only. Further, various primary components can be implemented with or without a buried layer of one or the other type of conductivity.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for fabricating an integrated circuit including complementary MOS transistors and a bipolar transistor of NPN type, including the following steps:

forming an N-type epitaxial layer on a P-type substrate, a buried layer being provided at least at a location where the bipolar transistor is formed, forming a thick oxide layer at locations other than locations of the MOS transistors, a collector region of the bipolar transistor and a base-emitter region of the bipolar transistor, forming parts of the MOS transistors, covering an entire structure with a protection layer including a first layer of silicon oxide and a first layer of silicon nitride, forming an opening in the protection layer at a base-emitter region of the bipolar transistor, depositing a first P-type doped layer of polysilicon or amorphous silicon, a second layer of silicon nitride and a second layer of oxide in the opening, forming an opening in the first p-type doped polysilicon layer or the silicon layer, second layer of silicon nitride, and second layer of oxide at a center of the emitter-base region, diffusing dopants contained in the first silicon layer in the underlying epitaxial layer to form an extrinsic base of the bipolar transistor, forming an N-type collector by implantation, implanting a P-type dopant to form an intrinsic base of the bipolar transistor, depositing a third silicon nitride layer, depositing a second layer of polysilicon, anisotropically etching the second polysilicon layer to form spacers over vertical portions of the base-emitter region and to expose a part of the third nitride layer, and removing the exposed part, depositing a third N-type doped polysilicon layer in the base-emitter region and diffusing dopants to form an emitter region of the bipolar transistor, depositing a planarized insulating layer, and performing metallizations.

2. A method according to claim 1, wherein the first layer of silicon oxide has a thickness of around 20 nm and the first to third silicon nitride layers have a thickness of around 30 nm.

3. A method according to claim 1, wherein the first silicon layer has a thickness of around 200 nm and the second silicon oxide layer has a thickness of around 300 nm.

4. A method according to claim 1, wherein the first silicon layer is obtained by deposition of undoped amorphous silicon, and then by superficial implant of $BF_2$.

5. A method according to claim 1, wherein during the step of forming the opening in the first P-type doped polysilicon or the amorphous silicon layer, the second silicon nitride layer, and the second oxide layer, includes forming an opening in the oxide layer that is wider than the opening in the second silicon nitride layer whereby, upon deposition of the third silicon nitride layer, this layer has a larger contact surface area with the second silicon nitride layer.

6. A method according to claim 1, further including, before the step of deposition of the third N-type doped polysilicon layer, the step of performing an opening in the second oxide layer, to expose a portion of the second silicon nitride layer, whereby the first and third polysilicon layers form a capacitor, a dielectric of which is formed of a portion of the second silicon nitride layer.

7. A method according to claim 6, wherein said opening in the second oxide layer is formed above a thick oxide area.

8. A method according to claim 1 wherein the epitaxial layer has a thickness in a range on the order of 1 to 1.2 $\mu$m.

9. A method according to claim 1 wherein said buried layer is of the N-type.

10. A method according to claim 8 wherein the thick oxide layer is formed with at least one thin oxide region.

11. A method according to claim 10 including implanting N-type wells and P-type wells in the epitaxial layer under respective thin oxide regions.

12. A method according to claim 11 including for insulated gates of the MOS transistors.

13. A method of fabricating an integrated circuit including MOS transistors and a bipolar transistor, said method comprising the steps of:

forming an epitaxial layer on a substrate;

forming a thick oxide layer with at least one thin oxide region over the epitaxial layer;

forming parts of the MOS transistors at said at least one thin oxide region;

forming a first layer of one of a doped polysilicon and an amorphous silicon;

opening said first layer at a base-emitter region of the bipolar transistor;

diffusing the dopant contained in the first silicon layer into the underlaying epitaxial layer to form an extrinsic base of the bipolar transistor;

implanting a dopant into a collector region;

forming an intrinsic base of the bipolar transistor;

depositing a first silicon nitride layer, depositing a second layer of polysilicon, etching the second polysilicon layer to leave in place spacers in vertical portions thereof, and removing exposed parts of the first silicon nitride layer, said spacers and remaining silicon nitride layer defining an opening for the intrinsic base; and depositing a third polysilicon layer at the base-emitter region and diffusing a dopant to form an emitter of the bipolar transistor.

14. A method according to claim 13 wherein the step of forming an epitaxial layer includes forming an N-type epitaxial layer on a P-type substrate.

15. A method according to claim 14, including forming an N-type well and a P-type well for respective P-channel MOS and N-channel MOS transistors.

16. A method according to claim 14 wherein the epitaxial layer has a thickness in a range on the order of 1.0 to 1.2 $\mu$m.

17. A method according to claim 15 wherein the step of forming a first layer includes forming a P-type doped polysilicon.

18. A method according to claim 13 wherein the step of forming an epitaxial layer includes providing a buried layer at least at the location of the bipolar transistor.

19. A method according to claim 13 wherein the step of forming the oxide layer includes forming a thick oxide layer at locations other than the locations of wells of the MOS transistors, of a collector well region of the bipolar transistor, and of the base-emitter region of the bipolar transistor.

20. A method according to claim 13 wherein, after the step of forming the MOS transistors, including covering the entire structure with a protection layer.

21. A method according to claim 20 wherein the protection layer includes a first layer of silicon oxide and a covering layer of silicon nitride.

22. A method according to claim 21 including opening the protection layer at the base-emitter location of the bipolar transistor.

23. A method according to claim 13 wherein the step of forming a first layer includes forming a P-type doped layer of polysilicon or amorphous silicon.

24. A method according to claim 13 including, after forming a first layer, forming a second layer of silicon nitride and a second layer of encapsulation oxide.

25. A method according to claim 24 wherein the step of opening said first layer includes also opening said second layer of silicon nitride and said second layer of encapsulation oxide.

26. A method according to claim 13 wherein the step of implanting a collector doping includes implanting an N-type collector doping.

27. A method according to claim 13 wherein the step of forming the intrinsic base includes implanting a P-type doping.

28. A method according to claim 27 wherein the step of etching the second polysilicon layer includes anisotropic etching.

29. A method according to claim 13 wherein the step of depositing a third polysilicon layer includes depositing a third N-type doped polysilicon layer.

30. A method according to claim 13 including after depositing the third polysilicon layer, depositing a planarized insulating layer.

31. A method according to claim 30 including after depositing the planarized insulating layer, performing a metallization.

32. A method according to claim 21 wherein the first layer of silicon oxide has a thickness of around 20 nm and the covering layer of silicon nitride has a thickness of around 30 nm.

33. A method according to claim 13 wherein the first silicon layer has a thickness of around 200 nm and the second silicon oxide layer has a thickness of around 300 nm.

34. A method according to claim 13 wherein a first silicon layer is obtained by deposition of undoped amorphous silicon, and then by superficial implant of BF2.

35. A method according to claim 13 wherein during the step of opening of the first P-type doped polysilicon or amorphous silicon layer, of the second silicon nitride layer, and of the second encapsulation oxide layer, an opening wider than in the second silicon nitride layer is formed in the encapsulation oxide layer, whereby, upon deposition of the third silicon nitride layer, this layer has a larger contact surface area with the second silicon nitride layer.

36. A method according to claim 13 further including, before the step of deposition of a third N-type doped polysilicon layer, the step of performing an opening in the second encapsulation oxide layer, to expose a portion of the second silicon nitride layer, whereby, at the level of this opening, the first and third polysilicon layers form a capacitor, a dielectric of which is formed of a portion of the second silicon nitride layer.

37. A method according to claim 13 wherein this opening is formed above a thick oxide area.

* * * * *